United States Patent
Aliane et al.

(10) Patent No.: US 9,228,908 B2
(45) Date of Patent: Jan. 5, 2016

(54) PHOTOSENSITIVE TACTILE SENSOR

(71) Applicant: COMMISSARIAT A L'ENERGIE ATOMIQUE ET AUX ENERGIES ALTERNATIVES, Paris (FR)

(72) Inventors: Abdelkader Aliane, Grenoble (FR); Mohammed Benwadih, Champigny sur Marne (FR); Tiphaine Card, Grenoble (FR)

(73) Assignee: COMMISSARIAT A L'ENERGIE ATOMIQUE ET AUX ENERGIES (FR)

( * ) Notice: Subject to any disclaimer, the term of this patent is extended or adjusted under 35 U.S.C. 154(b) by 0 days.

(21) Appl. No.: 14/388,536

(22) PCT Filed: Mar. 28, 2013

(86) PCT No.: PCT/FR2013/050672
§ 371 (c)(1),
(2) Date: Sep. 26, 2014

(87) PCT Pub. No.: WO2013/156702
PCT Pub. Date: Oct. 24, 2013

(65) Prior Publication Data
US 2015/0049330 A1    Feb. 19, 2015

(30) Foreign Application Priority Data
Apr. 20, 2012 (FR) .................................. 12 53649

(51) Int. Cl.
*G01L 1/16*    (2006.01)
*G06F 3/041*   (2006.01)
*G06F 3/042*   (2006.01)
(Continued)

(52) U.S. Cl.
CPC ... *G01L 1/16* (2013.01); *G01J 1/02* (2013.01); *G01J 1/58* (2013.01); *G06F 3/042* (2013.01); *G06F 3/0414* (2013.01); *H03K 17/964* (2013.01); *H03K 17/9627* (2013.01); *H03K 2217/94106* (2013.01)

(58) Field of Classification Search
CPC . H03K 17/964; H03K 17/96; H03K 17/9627; G01J 1/02; G01J 1/58; G01L 1/16; G06F 3/0414; G06F 3/042; G06F 3/0421
USPC ...................................................... 73/862.541
See application file for complete search history.

(56) References Cited

U.S. PATENT DOCUMENTS

| | | | | |
|---|---|---|---|---|
| 6,037,703 A * | 3/2000 | Kambe | ..................... | G01L 1/16 29/25.35 |
| 6,522,032 B1 | 2/2003 | Karnowka et al. | | |

(Continued)

OTHER PUBLICATIONS

International Search Report, Application No. PCT/FR2013/050672, Completed: Jun. 20, 2013; Mailing Date: Jun. 26, 2013, pp. 2.

*Primary Examiner* — Freddie Kirkland, III
(74) *Attorney, Agent, or Firm* — St. Onge Steward Johnston & Reens, LLC

(57) ABSTRACT

A tactile sensor including a piezoresistive layer having its electric resistance varying according to mechanical stress exerted thereon, the piezoresistive layer being at least partially transparent to light; a photosensitive layer, having its electric resistance varying according to the quantity of incident light thereon, the photosensitive layer being arranged opposite the piezoresistive layer; and electric connection elements electrically connecting in parallel the piezoresistive layer and the photosensitive layer.

14 Claims, 4 Drawing Sheets

(51) Int. Cl.
*H03K 17/96* (2006.01)
*G01J 1/02* (2006.01)
*G01J 1/58* (2006.01)

(56) References Cited

U.S. PATENT DOCUMENTS

| | | | | |
|---|---|---|---|---|
| 6,909,084 B2* | 6/2005 | Tachi | G01L 1/247 | 250/221 |
| 8,008,842 B2* | 8/2011 | Jiang | B06B 1/0622 | 310/334 |
| 8,526,770 B2* | 9/2013 | Casasanta | G02B 6/12 | 385/129 |
| 8,780,066 B2* | 7/2014 | Christiansson | G06F 3/0421 | 178/18.01 |
| 8,847,916 B2* | 9/2014 | Kurokawa | G02F 1/13338 | 345/156 |
| 8,981,213 B1* | 3/2015 | Micallef | H01L 31/00 | 136/243 |
| 2013/0100070 A1* | 4/2013 | Zheng | G06F 3/0425 | 345/174 |
| 2013/0141388 A1* | 6/2013 | Ludwig | G06F 3/0425 | 345/174 |
| 2014/0216174 A1* | 8/2014 | Aberg | G06F 3/041 | 73/862.628 |
| 2015/0009164 A1* | 1/2015 | Shinozaki | G06F 3/016 | 345/473 |

* cited by examiner

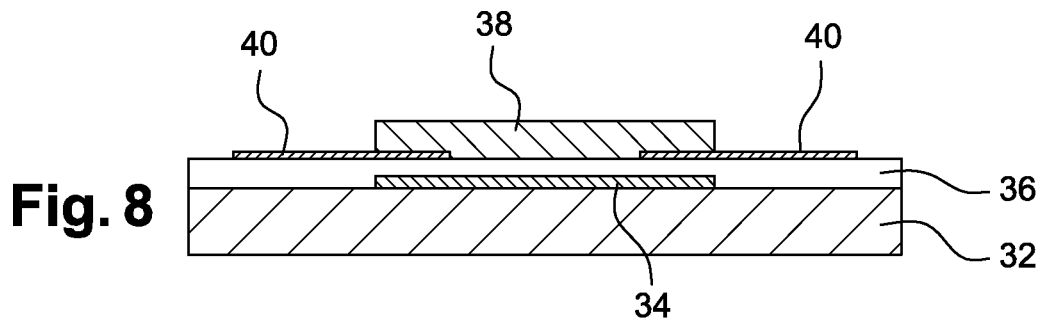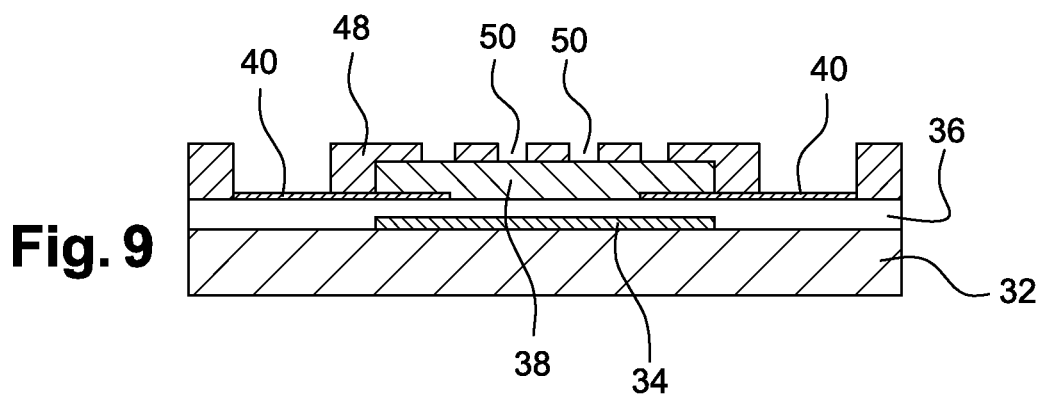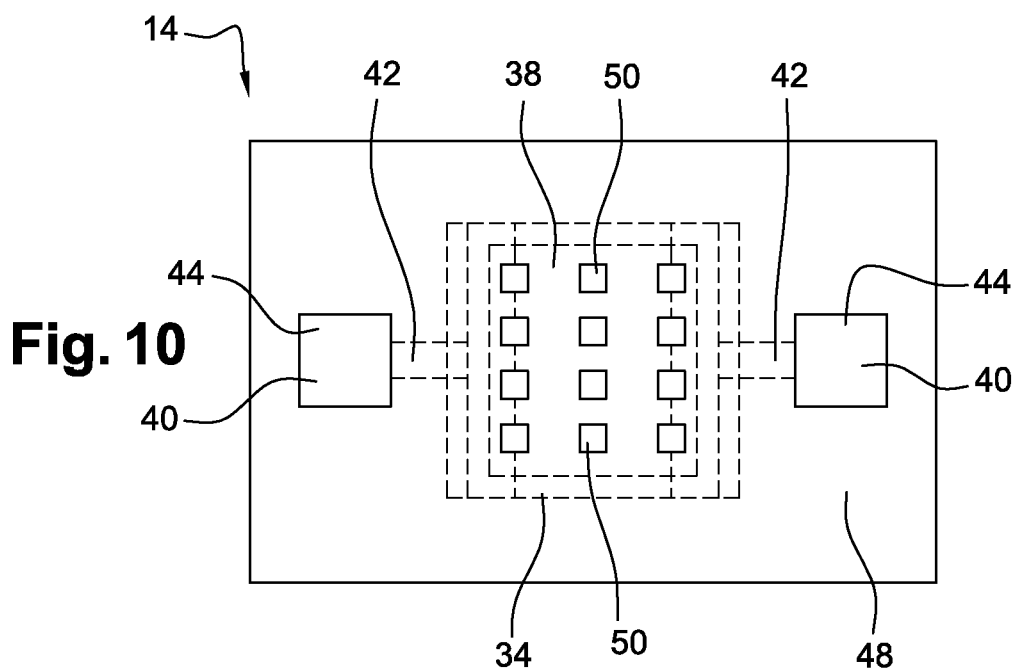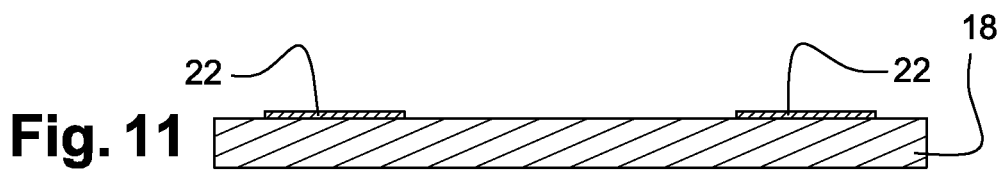

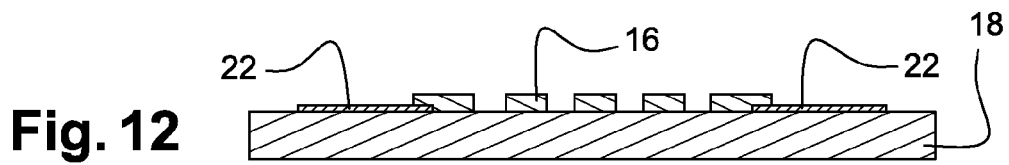
Fig. 12
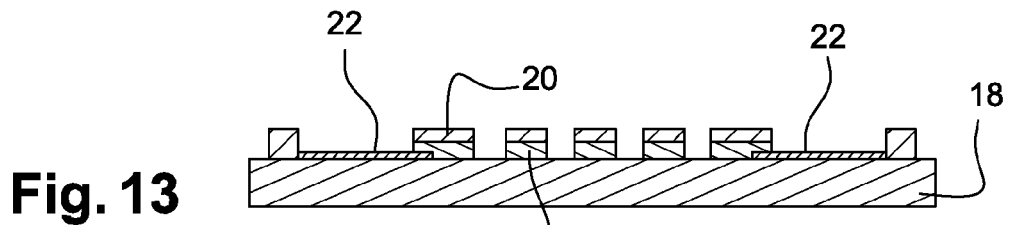
Fig. 13
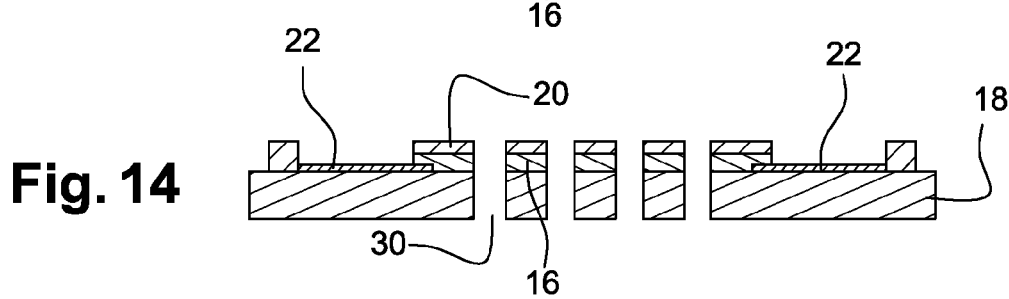
Fig. 14
Fig. 15
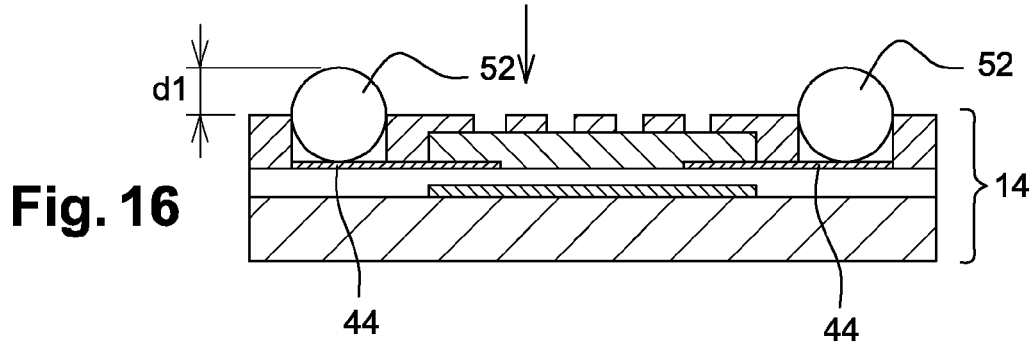
Fig. 16
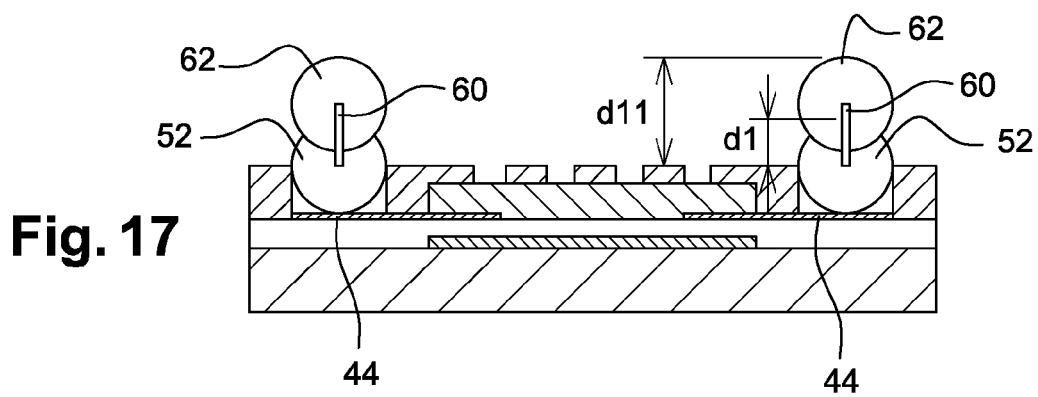
Fig. 17

# PHOTOSENSITIVE TACTILE SENSOR

FIELD OF THE INVENTION

The invention relates to the field of tactile sensors, particularly pressure-detection tactile sensors, and particularly applies in displays, keyboards, and touch pads.

BACKGROUND OF THE INVENTION

Displays, keyboards, and touch pads which detect a pressure exerted on them are known. Such devices include pressure sensors comprising a layer of piezoelectric material formed on a flexible support. When it is pressed on these devices, the piezoelectric material layer of the pressed sensor(s) deforms and releases electric charges which are detected by a dedicated electric circuit. The detection of the released charges then determines that a pressure is exerted on the device.

To obtain high-quality pressure sensors, piezoelectric materials which have both good mechanical qualities and good piezoelectric qualities are usually searched for.

It is in particular desired for these materials to have a good elasticity, a good adherence to the flexible support, as well as a low thermal expansion difference with the support. Indeed, too rigid a piezoelectric material is difficult to install on a flexible support, and if the thermal expansion coefficient difference is too large, the piezoelectric layer may separate from the support under the effect of temperature variations. The resulting pressure sensors are thus mechanically fragile. Piezoelectric materials having a high piezoelectric constant, that is, releasing a large quantity of charges when pressed, even slightly, are also searched for, to design sensors of high sensitivity.

Now, current piezoelectric materials have either good mechanical properties, or good piezoelectric properties. For example, piezoelectric materials currently used for pressure sensors comprise so-called "PZT" ceramics (acronym of lead titanium zirconium) and PVDF (acronym of polyvinylene fluoride).

However, although a PZT ceramic has a high piezoelectric constant, it has a very high Young's modulus, and thus insufficient mechanical properties. As for PVD, it has a low Young's modulus and more generally good mechanical properties, but however has a low piezoelectric constant.

For reasons of mechanical robustness, piezoelectric materials having a good mechanical behavior, and thus a low Young's modulus, are usually preferred. However, due to the low piezoelectric constant, and thus to their low response to an applied pressure, a so-called "capacitive" electric assembly is used to measure the quantity of released charges. In such an assembly, the piezoelectric material layer is in contact with electrodes and forms therewith a capacitive circuit, having its capacitance varying according to the released electric charges. A capacitance meter, connected to the electrodes, dynamically measures the capacitance of the capacitive circuit, particularly by imposing a variable voltage between the electrodes and/or by injecting therein a variable current of variable frequency. A capacitive electric assembly thus requires complex measurement means.

SUMMARY OF THE INVENTION

The present invention aims at providing a piezoresistive tactile sensor of increased sensitivity, which does not require using a capacitive electric assembly to measure the presence of an object at its surface.

For this purpose, the invention aims at a tactile sensor comprising:
 a piezoresistive layer having its electric resistance varying according to mechanical stress exerted thereon, the piezoresistive layer being at least partially transparent to light;
 a photosensitive layer, having its electric resistance varying according to the quantity of incident light thereon, the photosensitive layer being arranged opposite the piezoresistive layer; and
 electric connection elements electrically connecting in parallel the piezoresistive layer and the photosensitive layer.

In other words, the tactile sensor according to the invention combines two different and simultaneous physical phenomena to detect the presence of an object on its surface. Indeed, when an object, for example a finger, approaches the sensor, it masks the ambient luminosity and thus causes a luminosity variation detected by the sensor. By using the electric resistance variation properties of the piezoresistive layer and of the photosensitive layer, and by connecting them in parallel, a high variation of the electric resistance of the assembly is thus obtained when a finger presses the sensor and masks the light. Such a variation may particularly be statically measured, for example by applying a constant electric current of known value in the sensor and by measuring the resulting voltage thereacross. The voltage variation beyond a predetermined threshold then enables to characterize the pressure exerted on the sensor.

According to an embodiment, the piezoresistive layer and photosensitive layer are separated by a medium more deformable than the piezoresistive layer, particularly by a fluid or viscous liquid, a gas such as air, for example, a gas under a low pressure, vacuum, etc., which allows a large deformation of the piezoresistive layer, and thus a strong variation of its electric resistance.

According to an embodiment, the piezoresistive layer is arranged on a surface of an electrically-insulating protection layer, at least partially transparent to light and deformable, and the stack formed of the piezoresistive layer and of the protection layer comprises openings arranged in line with the photosensitive layer. The sensitivity of the sensor to ambient luminosity variations is thus substantially increased by the presence of the openings.

According to an embodiment, the piezoresistive layer is made in the form of a coil having a variable number of turns per surface area unit, and particularly a larger number of turns in a central area of the sensor than the number of turns in peripheral areas of the sensor. First, a coil has a width much smaller than its length. A deformation of the coil thus induces a strong variation of its electric resistance. Further, the number of turns per surface area unit provides a variable sensitivity of the sensor on its surface, particularly a higher sensitivity in a central area thereof.

Advantageously, the coil runs between openings formed in the protection layer, particularly between rows of openings.

According to an embodiment, the piezoresistive layer is made of PEDOT:PSS. PEDOT:PSS is a mixture of poly(3,4-ethylenedioxythiophene), or "PEDOT", and of poly(styrene sulfonate). PEDOT:PSS is a piezoresistive material having its electric resistance substantially varying according to the stress which is applied thereto. PEDOT:PSS also has the advantage of being transparent to visible and near infrared radiation.

According to an embodiment, the photosensitive layer comprises a mixture of graphene and of antimony-doped tin dioxide or "ATO". This material has the double advantage of being sensitive to a wide radiation spectrum, particularly to the red wavelength of the visible spectrum and of the near infrared spectrum, and of having an electric resistance which decreases according to the quantity of collected radiation. Particularly, a finger, which emits a significant quantity of infrared radiation, is detected by the photosensitive layer even if the ambient visible light is very low. Further, piezoresistive materials also have an electric resistance which increases when they are submitted to stress. By connecting in parallel an electric resistance which increases with the presence of an object and an electric resistance which decreases due to this same presence, a strong variation of the electric resistance of the assembly is obtained, which provides a sensor of high sensitivity.

Particularly, the proportion by weight of doped tin dioxide in the mixture is greater than 20%. It could thus be noted that such a proportion enables to optimally collect the radiation. For lower percentages, a decrease of the detection sensitivity can be observed.

According to an embodiment, the photosensitive layer is formed between the piezoresistive layer and a light-reflecting layer. The reflective layer enables to send back to the photosensitive layer the radiation having crossed it, for example, due to the small thickness of this layer. Thereby, the sensor sensitivity is increased.

Particularly, the reflective layer is capable of reflecting wavelengths in the visible and near infrared range.

Advantageously, the photosensitive layer is separated from the reflective layer by a distance $$d = \frac{\lambda}{4n},$$

where $\lambda$ is a wavelength of near infrared and n is the refraction index of the medium separating the photosensitive layer from the reflective layer. Thereby, a resonance phenomenon is obtained in the photosensitive layer for the selected wavelength $\lambda$, which increases the sensor sensitivity to this wavelength.

According to an embodiment, the piezoresistive layer and the photosensitive layer are installed on each other by means of metal balls electrically connecting them in parallel. Thereby, it is possible to manufacture independently from each other the sensitive layers and then to install them. Finally, the balls enable to adjust the distance separating the latter, particularly to focus the incident light on the photosensitive layer.

Particularly, the piezoresistive layer and the photosensitive layer are installed on each other by means of stacks of at least two conductive balls attached to each other by an insert. Thereby, it is possible to adjust the distance separating the piezoresistive layer and the photosensitive layer by adjusting the number of stacked balls.

BRIEF DESCRIPTION OF THE DRAWINGS

The present invention will be better understood on reading of the following description provided as an example only in relation with the accompanying drawings, where the same reference numerals designate the same or similar elements, among which:

FIGS. 5 to 16 are simplified top and cross-section views illustrating a method of manufacturing a sensor according to the invention; and FIG. 17 is a simplified cross-section view of a variation of balls for the hybridization of two portions of the sensor according to the invention.

DETAILED DESCRIPTION OF THE INVENTION

Figure 1:
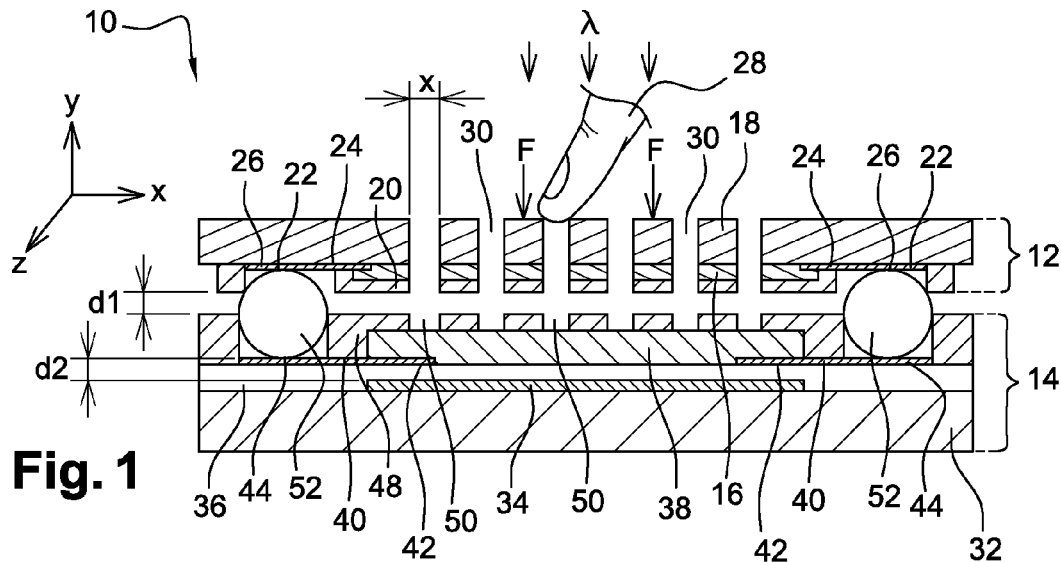
FIG. 1 is a simplified cross-section view of a sensor according to the invention.

Referring to the simplified cross-section view of FIG. 1, a tactile sensor 10 according to the invention, for example, intended to be incorporated in a display, a keyboard, or a touch pad, comprises a pressure sensor 12 and a light sensor 14. The latter is arranged under pressure sensor 12 and in line therewith, the two sensors 12, 14 being electrically connected in parallel.

Pressure sensor 12 comprises a piezoresistive material 16, formed of a piezoelectric material, having its electric resistance varying according to the mechanical stress applied to this material, interposed between protection layers, particularly a flexible substrate 18 defining a tactile surface, and an electrically-insulating protection layer 20.

Piezoresistive layer 16 is advantageously made of PEDOT:PSS, for example, having a thickness in the range from 10 nm to 5 μm. PEDOT:PSS is a piezoresistive material, that is, a material having its electric resistance strongly varying with the stress applied thereto as compared with other types of known piezoresistive materials. Further, PEDOT:PSS is also sensitive to temperature, and its electric resistance decreases as the temperature decreases. Further, such a material is substantially transparent to visible and near infrared radiation.

Conductive elements 22, for example, made of gold, platinum, nickel, copper, silver, or aluminum, are further formed on substrate 18 in contact with piezoresistive layer 16, to submit it to a voltage and/or to inject an electric current into it, as will be explained in further detail hereafter. For example, conductive elements 22 comprise two assemblies of metal tracks 24 in contact with layer 16 and respectively connected to two metal areas 26.

Flexible substrate 18 is selected to be deformable under the pressure exerted by an object at its surface, for example, by a finger 28 or a stylus. Flexible substrate 18 is for example formed of a thin plastic film having a thickness in the range from 25 μm to 200 μm.

Pressure sensor 12 is further designed to be transparent, at least partially, to the radiation detected by light sensor 14. The transparency is obtained by selection of the materials forming sensor 12, and/or the thickness of the layers forming it and/or by forming in the sensor privileged paths for light, for example, openings.

Advantageously, substrate 18 is thus made of a material at least partly transparent to visible light. For this purpose, substrate 18 is made of polyethylene naphthalate ("PEN") or of poly(ethylene terephthalate) ("PET"), which has the triple advantage of being flexible, transparent to the visible spectrum and to near infrared, and of having a low cost.

Similarly, protection layer 20 is preferably formed in a dielectric material at least partially transparent to the radiation detected by sensor 14. For example, layer 20 is a CYTOP-type fluoro-polymer layer, which is transparent and has a low permittivity, and a thickness in the range from 10 nanometers to 500 nanometers.

Figure 2:
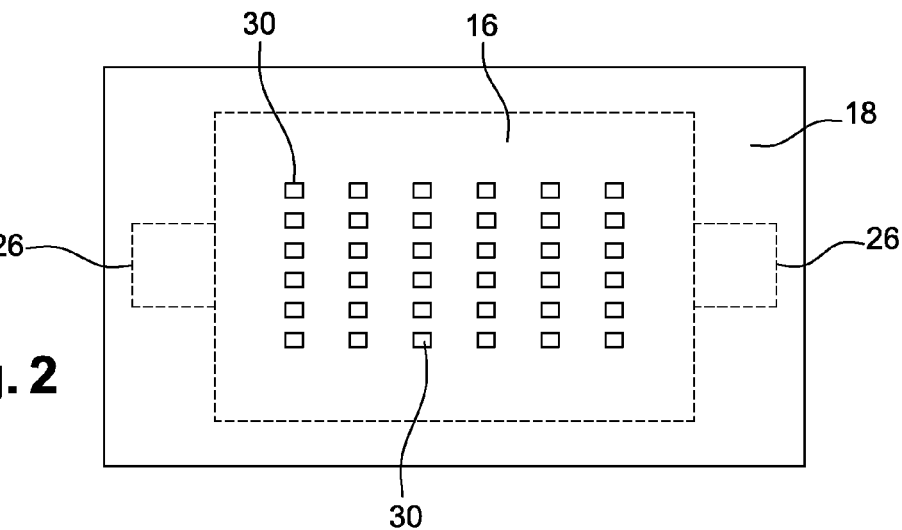
FIG. 2 is a simplified top view of the sensor of FIG. 1.

Openings 30 are also formed through pressure sensor 12, and in line with light sensor 14, to increase the general transparency of sensor 12. For example, as illustrated in the simplified top view of FIG. 2, a bidimensional network, particularly periodic, of openings, is formed through substrate 18, piezoresistive layer 16, and protection layer 20. Openings for example have a square cross-section and a side length in the range from 50 nanometers to 5 micrometers. Piezoresistive layer 16 is made in the form of a solid rectangular layer crossed by openings 30.

Figure 3:
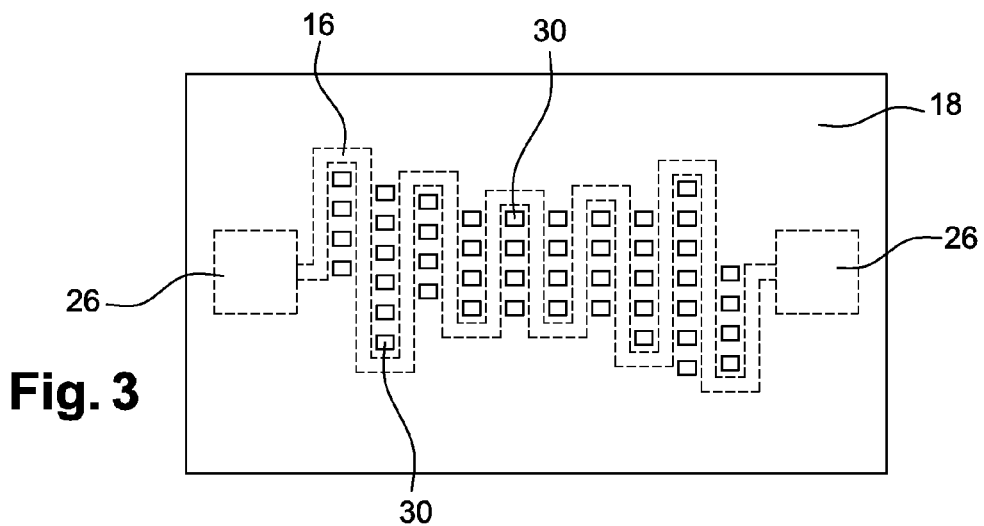
FIG. 3 is a simplified top view of a variation of the sensor of FIG. 2.

Advantageously, and as illustrated in the simplified top view of FIG. 3, piezoresistive layer 20 takes, as a variation, the shape of a coil running between rows of openings 30. A coil has a length much greater than its width, so that an increased variation of its electric resistance according to the pressure exerted on its surface is obtained. Preferably, the coil comprises more turns in a central area of pressure sensor 12 than at the periphery thereof. Thereby, the pressure sensor is more sensitive on this central area than at its periphery due to the low resonance frequency which provides a maximum stress at the center of the piezoresistive structure.

Referring again to FIG. 1, light sensor 14 comprises a substrate 32 supporting a reflective layer 34. Layer 34 is covered with a layer 36 made of electrically insulating material at least partially transparent to the radiation detected by light sensor 14. The latter also comprises a photosensitive layer 38 formed on insulating layer 36. Conductive elements 40, for example, made of gold, platinum, nickel, copper, silver, or aluminum, are further formed on insulating layer 36 in contact with photosensitive layer 38 to submit it to a voltage and/or to inject an electric current into it, as will be explained in further detail hereafter. For example, conductive elements 40 comprise two assemblies of metal tracks 42 in contact with layer 38 and connected to two metal areas 44. The assembly is optionally covered with an electrically-insulating protection layer 48, except for conductive areas 44 which remain exposed, and openings 50 are formed in layer 48 in line with openings 30 of pressure sensor 12.

Substrate 32 advantageously is a flexible and transparent substrate, for example, a plastic substrate, such as PEN or PET, having a thickness in the range from 25 µm to 200 µm.

Photosensitive layer 38 is advantageously formed of a mixture of graphene and ATO (antimony-doped tin dioxide (SnO2:Sb)), the proportion by weight of ATO in the mixture is advantageously greater than 20%. Such a material is capable of sensing in the visible spectrum (particularly in red) as well as in near infrared, and further has an electric resistance which decreases according to the quantity of sensed radiation. Photosensitive layer 38 thus captures the ambient light variations induced by the presence of finger 28, as well as the heat variations induced by the presence of finger 28, such heat variations reflecting as variations of the near infrared radiation emitted by the finger.

Optionally, the material of insulating layer 36 as well as the distance separating photosensitive layer 38 from reflective layer 34 are selected to satisfy relation $$d = \frac{\lambda}{4n},$$

where d is said distance, λ is a near infrared wavelength, and n is the refraction index of layer 36. A phenomenon of electromagnetic resonance at wavelength λ is thus obtained, which increases the sensitivity of sensor 12 to this wavelength.

Reflective layer 34 is made of a material providing a significant reflection of the radiation detected by photosensitive layer 38. For example, the reflective layer is a silver, aluminum, or gold metal layer, such materials having a strong reflective power in the visible and near infrared range.

Insulating layer 36 is made of a material transparent to the radiation detected by photosensitive layer 38, for example, a dielectric of organic polymer type or an inorganic oxide such as $SiO_2$, $ZrO_2$, $TiO_2$, etc. Such materials have a strong transparency in the visible and near infrared range.

Pressure sensor 12 and light sensor 14 are advantageously installed on each other by means of metal balls 52, each arranged between connection areas 26, 44 arranged opposite thereto respectively on sensors 12, 14. Sensors 12 and 14 are thus electrically connected in parallel. Further, balls 52 space them by a distance $d_1$ enabling pressure sensor 12 to strongly curve under the pressure exerted at its surface, and thus to undergo a strong variation of its electric resistance. The space separating pressure sensor 12 from light sensor 14 is further filled with a gas such as air, under low pressure or not, vacuum, a fluid or viscous liquid, etc. Of course, the two functions may be implemented by distinct elements.

Figure 4:
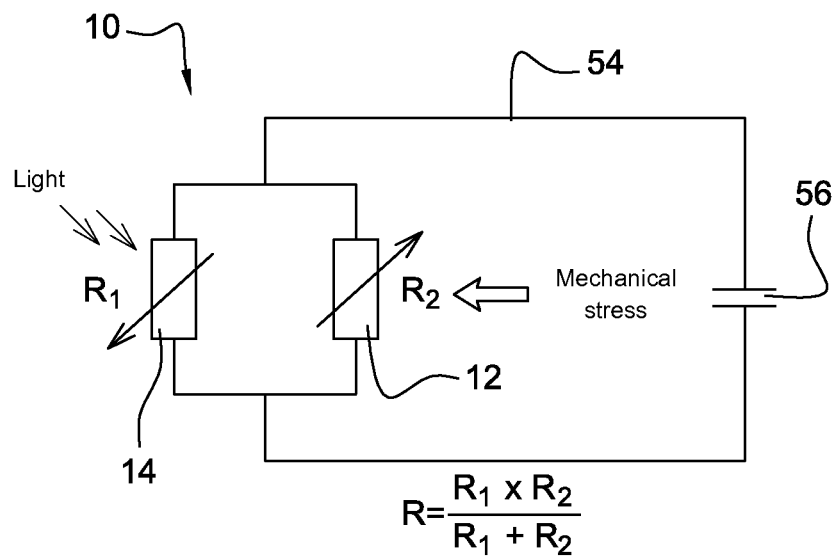
FIG. 4 is an equivalent electric diagram of the sensor according to the invention.

FIG. 4 is an equivalent electric diagram of the sensor according to the invention. Piezoresistive and photosensitive layers 16 and 38 being electrically connected in parallel, sensor 10 has a total electric resistance equal to $$R = \frac{R_1 \times R_2}{R_1 + R_2},$$

where $R_1$ and $R_2$ respectively are the electric resistances of the photosensitive layer and of the piezoresistive layer.

Sensor 10 is for example connected to an electric circuit 54 comprising a constant current or voltage source enabling to perform a static measurement of its resistance or of an electric quantity related thereto, such a measurement being analyzed by an analog or digital processing circuit (not shown) to determine an event at the sensor surface, such as the presence of a finger, for example.

Sensor 10 according to the invention thus combines three different detection modes, that is, a piezoresistive tactile detection mode, a light detection mode, as well as a detection mode combining the tactile and light detection mode.

In the piezoresistive detection mode, the pressure exerted on substrate 18 induces a piezoresistive effect, that is, the variation of the electric resistance of piezoresistive layer 16 under the effect of the stress applied thereto. The fact of pressing on substrate 18 indeed causes a local deformation of piezoresistive layer 16, which generates a variation of its electric resistance, which variation reflects as a corresponding variation of an electric quantity, particularly a current or an electric voltage. The exerted pressure is then determined by for example using a table of predetermined variations of the measured electric quantity according to applied pressure values.

In the light detection mode, when one surface, or both surfaces of sensor 10 are illuminated, the electric resistance of the photoresistance formed of photosensitive layer 38 varies according to the light intensity, and the variation of this resistance translates as an electric quantity, be it current or voltage, which is read by a read circuit in a way similar to that described hereabove. Further, the light detection mode enables to also detect thermal waves in near infrared, and thus enables to detect a finger when the ambient light in the visible spectrum is of low intensity. It should also be noted that the materials and the layers forming light sensor 14 enable to detect an incident light on substrate 32, whereby a pure light detection is possible, should the application require it.

In the detection mode combining piezoresistive detection and light detection, an object exerting a pressure at the surface of pressure sensor 12 also masks the ambient luminosity and thus causes a light variation sensed by light sensor 14. When the object is a finger, heat waves in near infrared may further be detected by the latter. The combination of such phenomena generates a strong variation of the general electric resistance of the sensor, thus allowing a high-sensitivity detection.

A method of manufacturing a sensor according to the invention will now be described in relation with FIGS. 5 to 16, sensors 12 and 14 being manufactured independently from each other.

Figure 5:
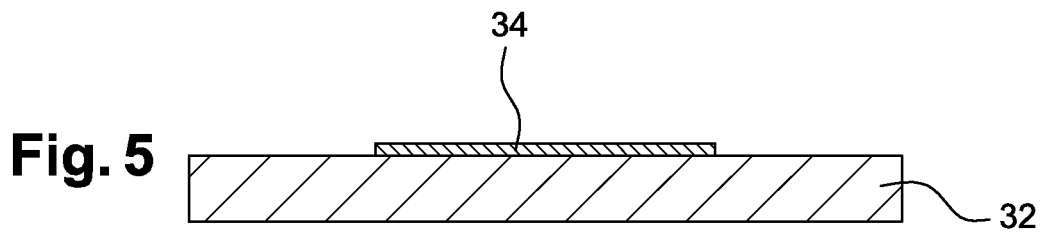

The manufacturing of light sensor 14 starts with the forming of a low-cost flexible plastic substrate 32 of PEN or PET type having a thickness in the range from 25 to 200 micrometers, and carries on with the deposition of a reflective metal layer 34, for example, made of silver, aluminum, or gold, by means of a physical vapor deposition, of a silk screening, or of an inkjet printing (FIG. 5).

Figure 6:
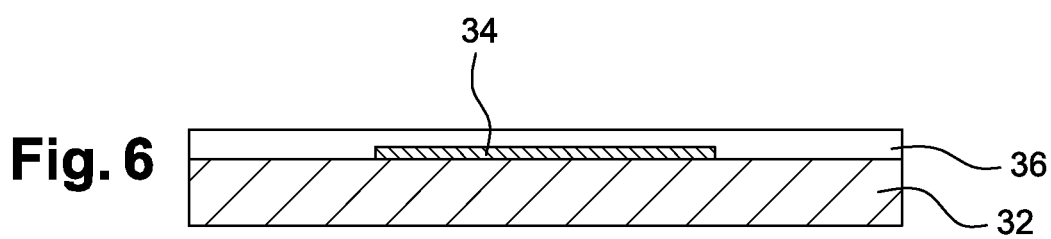

An electrically insulating and transparent layer 36 is then deposited, for example, by mean of a physical vapor deposition, a silk screening, or an inkjet printing, on the obtained assembly. The thickness of layer 36 is selected to maximize the reflection of the light flow on the photosensitive element, which will be deposited afterwards (FIG. 6). The material forming layer 36 for example is a dielectric of organic polymer type or an inorganic passivation oxide such as $SiO_2$, $ZrO_2$, $TiO_2$, or the like.

Figure 7:
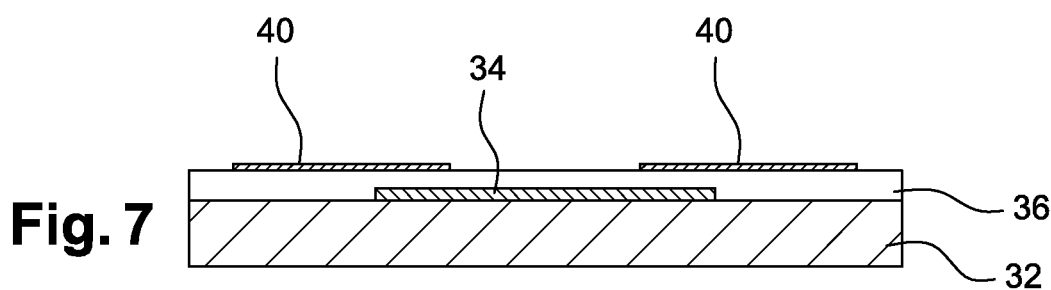

Two connection electrodes 40 are then formed on layer 36 by means of a physical vapor deposition, a silk screening, or an inkjet printing (FIG. 7). Electrodes 40 are for example made of conductive graphene or of a metal, particularly gold, silver, aluminum, platinum, copper, or titanium.

The method carries on with the deposition of photosensitive layer 38 made of a mixture of graphene and ATO with a minimum 20% by weight of ATO (FIG. 8). The deposition is for example performed by means of a silk screening or of an inkjet printing depositing a mixture of a conductive graphene ink and of an ATO ink. Solvents of graphene ink and of ATO ink advantageously have close evaporation temperatures in order to form a very uniform deposited layer. The evaporation temperatures of the solvents are also advantageously selected to be compatible in terms of anneal with an anneal temperature of the layers already formed on deposition of the ink mixture, and particularly evaporation temperatures lower than the vitreous transition temperature of plastic substrate 32. Particularly, the evaporation temperatures are in the range from 110 to 180° C.

A dielectric layer 48 is then deposited on the assembly, for example, by means of a physical vapor deposition, of a silk screening, or of an inkjet printing, and openings 50 are formed in layer 48 all the way to photoresistive layer 38 (FIGS. 9 and 10). The openings are for example formed by means of a silk screening or of a lithography.

The manufacturing of pressure sensor 12 starts with the forming of a low-cost flexible plastic substrate 18 of PEN or PET type, having a thickness in the range from 25 to 200 micrometers, and carries on with the forming of two electrodes 22, particularly by means of a full-plate deposition, for example, a physical vapor deposition, or by silk screening or by inkjet printing, followed by a chemical, physical, or laser etching, to define electrodes 22 (FIG. 11). Electrodes 22 are for example made of conductive graphene or of a metal, particularly gold, silver, aluminum, platinum, copper, or titanium.

The method carries on with the deposition and the definition of the geometry of the piezoresistive material. A piezoresistive layer 16, advantageously made of PEDOT:PSS, is deposited on substrate 18 and partially on the two electrodes 22, for example, by silk screening or by inkjet printing. The geometric shape of piezoresistive layer 16 is advantageously selected to increase the sensitivity of pressure sensor 12 at the center thereof by defining the coil pattern with sharper turns at the center of the sensor (FIG. 12).

A transparent protection layer 20 made of insulating material, for example dielectric, is then deposited on the stack obtained for the protection of PEDOT:PSS layer 16 (FIG. 13). Layer 20 is for example deposited by silk screening or by inkjet printing, and more generally by means of a low-temperature deposition compatible with plastic substrate 18. An anneal is then applied to rigidify layer 20.

Openings 30 are then formed in substrate 18, for example, by means of a laser etching, of a plasma etching, or of a chemical etching, through a lithography mask (FIG. 14). The dimensions of openings 30 across the thickness of substrate 18, and thus across pressure sensor 12, are advantageously optimized to have a maximum light transfer towards light sensor 14. Particularly, the dimensions of the openings are selected to limit or avoid phenomena of diffraction by the layers forming pressure sensor 12 for the wavelengths detected by light sensor 14.

Once pressure and light sensors 12 and 14 are completed, they are preferably assembled by means of a conductive ink, for example, containing silver.

Particularly, a drop of a conductive epoxy-type ink or the like comprising silver is deposited on each of connection areas 44 of light sensor 12, for example, by silk screening or by means of a microsyringe. The ink volume and the deposition conditions enable to adjust distance $d_1$ separating pressure sensor 12 from light sensor 14 (FIG. 16). A light anneal is then carried out to solidify the surface of the ink drops, after which pressure sensor 12 is then placed on conductive balls 52. A final anneal is then applied to solidify the assembly of conductive balls.

It is also possible to adjust the distance separating the two sensors 12, 14 by stacking drops having dimensions which are known individually. For example, if the deposition of a drop enables to define a known standard distance, it is possible to double this distance by stacking two drops.

Referring to FIG. 17, a first drop of conductive ink 52 is deposited on each connection area 44, after which a surface anneal of the drops is applied to solidify their upper surfaces.

A rigid conductive metal insert 60 having high properties of adherence with the conductive ink, is then inserted into each of the drops to mechanically support the structure of the final sensor and to prevent the fatigue thereof resulting from the multiple tactile contacts applied thereto.

For example, inserts 60 are rods of conductive carbon, tungsten, nickel, titanium nitride, or tungsten nitride nanotubes.

A second drop 62 is then deposited on each of first drops 52, after which an anneal is applied to rigidify the assembly.

Other types of installation are of course possible, the installation by means of a conductive ink having the advantage of not requiring temperatures incompatible with the plastic materials present in the sensor.

A transparent PEDOT:PSS piezoresistive layer has been described. Other materials are however possible, such as, for example, graphene.

Similarly, a photosensitive layer made of a mixture of graphene and of ATO has been described. Other photosensitive materials are of course possible.

The invention claimed is:

1. A tactile sensor comprising:
   a piezoresistive layer having an electric resistance varying according to mechanical stress exerted thereon, the piezoresistive layer being at least partially transparent to light;
   a photosensitive layer having an electric resistance varying according to a quantity of incident light thereon, the photosensitive layer being arranged opposite the piezoresistive layer; and
   electric connection elements electrically connecting in parallel the piezoresistive layer and the photosensitive layer.

2. The tactile sensor of claim 1, wherein the piezoresistive layer and the photosensitive layer are separated from each other by a medium more deformable than the piezoresistive layer.

3. The tactile sensor of claim 1 wherein the piezoresistive layer is arranged on a surface of an electrically-insulating protection layer, at least partially transparent to light and deformable, and wherein a stack formed of the piezoresistive layer and of the protection layer comprises openings arranged in line with the photosensitive layer.

4. The tactile sensor of claim 1 wherein the piezoresistive layer is made in the form of a coil having a variable number of turns per surface area unit.

5. The tactile sensor of claim 4, wherein the coil runs between openings formed in the protection layer.

6. The tactile sensor of claim 5 wherein the coil runs between rows of openings formed in the protection layer.

7. The tactile sensor of claim 4 wherein the coil has a larger number of turns in a central area of the sensor than a number of turns in peripheral areas of the sensor.

8. The tactile sensor of claim 1 wherein the piezoresistive layer is made of PEDOT:PSS.

9. The tactile sensor of claim 1 wherein the photosensitive layer comprises a mixture of graphene and of antimony-doped tin dioxide.

10. The tactile sensor of claim 9, wherein a proportion by weight of doped tin dioxide in the mixture is greater than 20%.

11. The tactile sensor of claim 1 wherein the photosensitive layer is formed between the piezoresistive layer and a light-reflecting layer.

12. The tactile sensor of claim 11, wherein the reflective layer is capable of reflecting wavelengths in the visible and near infrared range.

13. The tactile sensor of claim 1 wherein the piezoresistive layer and the photosensitive layer are installed on each other by means of conductive balls electrically connecting the piezoresistive layer and the photosensitive layer in parallel.

14. The tactile sensor of claim 13, wherein the piezoresistive layer and the photosensitive layer are installed on each other by means of stacks of at least two conductive balls attached to each other by an insert.

* * * * *